United States Patent [19]

Marriott

[11] 4,030,016
[45] June 14, 1977

[54] PRECISION ACTIVE RECTIFIER CIRCUIT

[75] Inventor: Joe E. Marriott, Loveland, Colo.

[73] Assignee: Hewlett-Packard Company, Palo Alto, Calif.

[22] Filed: Mar. 26, 1976

[21] Appl. No.: 670,805

[52] U.S. Cl. .............................. 321/8 R; 307/260; 321/47; 328/26; 330/100; 324/119
[51] Int. Cl.² .......................................... H02M 7/00
[58] Field of Search ............... 307/260; 321/8, 47; 328/26; 330/100, 110; 324/119

[56] References Cited

UNITED STATES PATENTS

| | | | |
|---|---|---|---|
| 3,411,066 | 11/1968 | Bravenec | 321/8 R |
| 3,500,153 | 3/1970 | Werner, Jr. | 330/100 X |
| 3,531,656 | 9/1970 | Ammann | 328/26 X |
| 3,553,566 | 1/1971 | Nagy, Jr. | 324/119 X |
| 3,787,755 | 1/1974 | Goldner | 321/47 X |
| 3,942,095 | 3/1976 | Togneri et al. | 321/47 |
| 3,971,984 | 7/1976 | Bench | 324/119 X |

OTHER PUBLICATIONS

A. Foord, "Precision A.C. to D.C. Converter", Radio & Electronics Constructor, vol. 28, No. 1, Aug. 1974, pp. 25–29.

Primary Examiner—William M. Shoop
Attorney, Agent, or Firm—William E. Hein; Michael L. Sherrard

[57] ABSTRACT

An improved feedback/compensation scheme for a precision active rectifier circuit improves the slew rate and loop gain during diode switching and thereby reduces fractional scale linearity problems.

8 Claims, 3 Drawing Figures

PRECISION ACTIVE RECTIFIER CIRCUIT

BACKGROUND AND SUMMARY OF THE INVENTION

This invention relates generally to active rectifier circuits and more particularly to an improved averaging type AC to DC converter.

Prior art active rectifier circuits incorporate a complementary diode pair in a negative feedback loop. The loop gain decreases the non-linear effect of the diode switching but must be less than unity at 180° phase shift to avoid unstable feedback. This is accomplished by the use of a compensation capacitor across a stage of the amplifier to introduce a dominant pole. This technique purposely reduces loop gain at higher frequencies but additionally decreases the maximum slew rate of the output.

Prior art active rectifier circuits therefore suffer from two limitations. First, the gain must be decreased for feedback stability, thus adversely affecting the detection and accurate rectification of small signals. Second, the decreased slew rate of the output adversely affects the accurate rectification of large and/or high frequency signals.

Accordingly, the principal objects of this invention are to increase the gain for small signals, to increase the slew rate of the output, and to avoid unstable feedback. Other and incidental objects of the present invention will become apparent from a study of the following detailed description.

These objects are accomplished in accordance with the preferred embodiment by activating the known compensating feedback loop only when one of the complementary rectifying diodes is on and by allowing the amplifier to run 'open loop' during diode switching. The compensation feedback loop is split into two alternate loops in the present invention, each loop incorporating one of the complementary rectifying diodes and a gain reducing capacitor. The incorporation of the diodes in the alternate feedback loops effectively opens the compensation feedback loop when the diodes are switching, thus significantly increasing the gain when detecting small signals and simultaneously increasing the slew rate of the output for accurate rectification of large and/or high frequency signals.

DESCRIPTION OF THE PREFERRED EMBODIMENT

Figure 1:
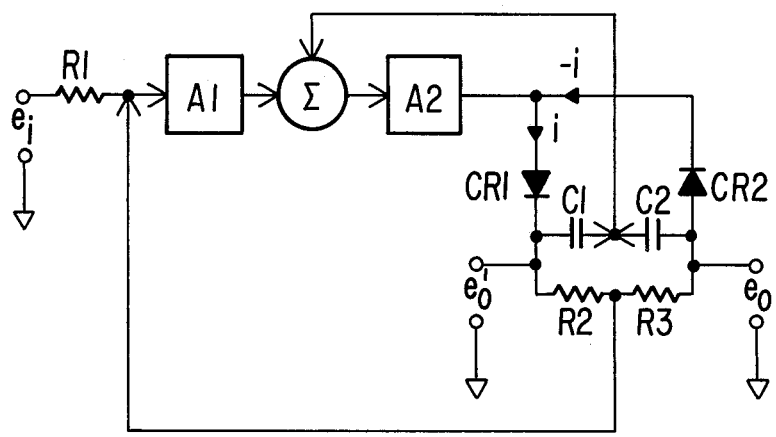
FIG. 1 is a block diagram illustrating a precision active rectifier circuit embodying the principles of the present invention.

Referring to FIG. 1, an input potential $e_i$ is applied to a first resistor R1. The first resistor R1 is connected to a first amplifier A1. The connection between first resistor R1 and amplifier A1 will be kept at a virtual ground by an outer feedback loop described below. The first amplifier A1 is serially connected to a second amplifier A2. The output of the second amplifier A2 is applied to two compensating feedback loops, the output of the compensating feedback loops being summed with the output of the first amplifier A1 and the summed signal being applied to the input of the second amplifier A2. The first compensating feedback loop comprises a diode CR1 connected to the amplifier A2 and a capacitor C1 connected to the diode CR1, the loop being active when the voltage across the diode CR1 is greater than the electrostatic potential barrier of the diode CR1, typically 0.4 volts. The second compensating feedback loop comprises a diode CR2 connected to the amplifier A2 and a capacitor C2 connected to the diode CR2, the diode CR2 oriented opposite to the diode CR1 so that the second compensating feedback loop is active when the voltage across the diode CR2 is greater than the electrostatic potential barrier of the diode CR2. Thus, no feedback is active on amplifier A2 when the diodes are switching (both diodes are off). During diode switching the compensating feedback loop is effectively open and amplifier A2 unattenuated. The input signal, $e_i$, half-wave rectified and amplified becomes the output, $e_o'$, of the diode CR1. Output $e_o$ is the complement of output $eo'$. Outputs $e_o'$ and $e_o$ are connected through resistors R2 and R3 respectively to the input of the amplifier A1 to complete the outer feedback loop. A person skilled in the art will appreciate that capacitors C1 and C2 lower the compensation loop gain for higher frequencies and that their values are chosen to eliminate unstable feedback in the outer feedback loop to amplifier A1.

Figure 2:
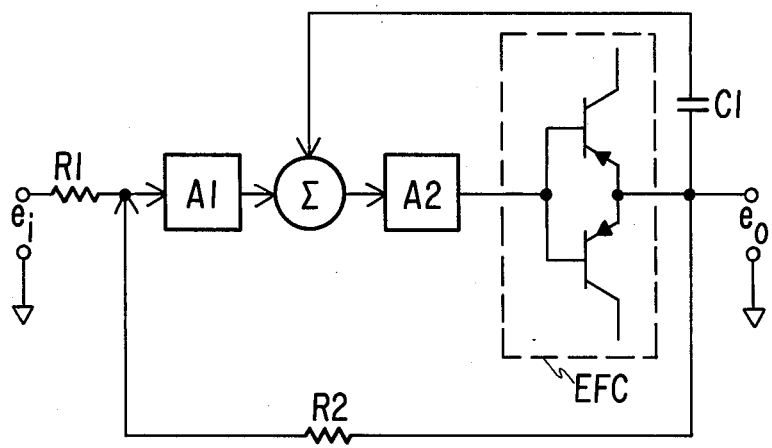
FIG. 2 is a block diagram illustrating a second embodiment of the principles of the present invention employed in a complementary emitter-follower circuit.

Referring now to FIG. 2, a second embodiment of the principles of the present invention is illustrated as employed in a complimentary emitter-follower circuit. An input potential $e_i$ is applied to a first resistor R1. The first resistor R1 is connected to a first amplifier A1. This node will be held at a virtual ground by the outer feedback loop described below. The first amplifier A1 is serially connected to a second amplifier A2. The output of the second amplifier A2 is applied to a compensating feedback loop, the output of the compensating feedback loop being summed with the output of the first amplifier A1, and the summed signal being applied to the input of the second amplifier A2. The compensating feedback loop comprises a complementary emitter-follower circuit EFC and a capacitor C1 connected to the emitter-follower circuit EFC, the loop being active when the voltage across the complementary emitter-follower circuit EFC is greater than the electrostatic potential barrier of one of the base to emitter junctions of the transistors within the emitter-follower circuit, typically ±0.4 volts. Thus, no feedback is active on amplifier A2 when the transistors are switching. The input, $e_i$, linearly amplified, is the output of the emitter-follower circuit EFC. The output of the emitter-follower circuit EFC is connected through resistor R2 to the input of the amplifier A1 to complete the outer feedback loop. Persons skilled in the art will appreciate the fact that capacitor C1 lowers the compensating loop gain for higher frequencies and that its value is chosen to eliminate unstable feedback in the outer feedback loop to amplifier A1. During transistor switching, the compensating feedback loop is effectively open, and the gain of amplifier A2 is unattenuated by feedback.

Figure 3:
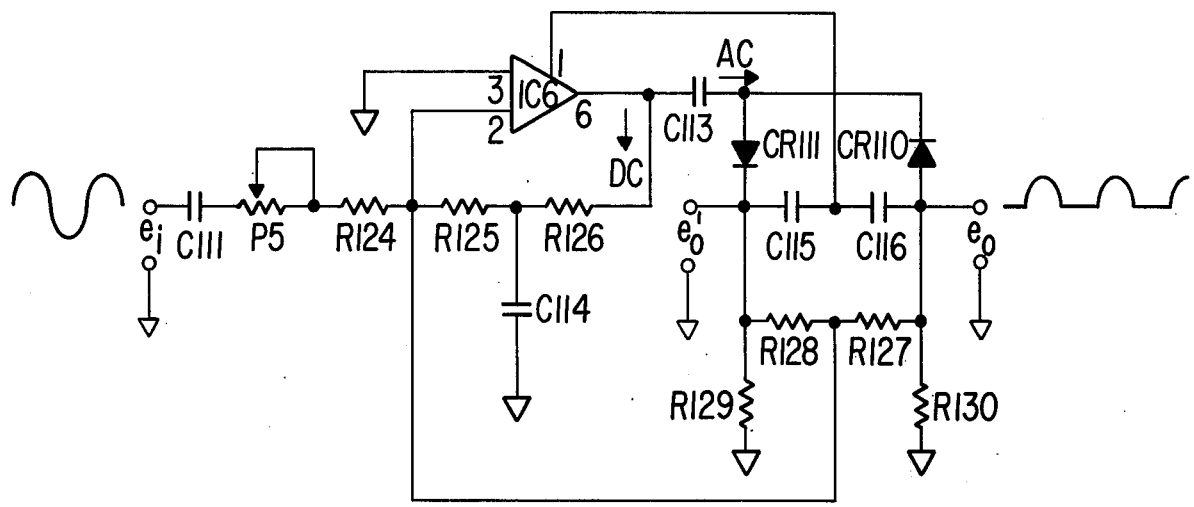
FIG. 3 is a detailed schematic diagram illustrating the preferred embodiment of the present invention in a precision active rectifier circuit according to the block diagram of FIG. 1.

FIG. 3 illustrates an implementation of the first preferred embodiment of the present invention of FIG. 1 in a precision active rectifier circuit where an operational amplifier provides both of the gain stages and access to an intermediate compensating mode. The input signal, $e_i$, is AC coupled across capacitor C111, and the circuit gain is adjusted by varying the resistance of potentiometer P5. The output of potentiometer P5 is applied to a resistor R124 which is then serially connected to Pin 2 of a LM301 operational amplifier IC6. The output of the operational amplifier is taken from Pin 6 and AC coupled by capacitor C113 to two alternate compensating feedback loops, the first comprising diode CR111 and capacitor C115 and the second comprising diode CR110 and capacitor C116. The diodes CR111 and CR110 are opposite in orientation and are complementary to one another. The compensating feedback loops are summed and applied to the operational amplifier IC6 at an intermediate gain point Pin 1. The outputs of diodes CR111 and CR110 are fed back to the input Pin 2 of the operational amplifier IC6 after passing through resistors R128 and R127 respectively. Persons skilled in the art will recognize that resistors R125, R126 and capacitor C114 comprise a typical DC biasing network and that resistors R129 and R130 comprise loads for the output of the precision active rectifier circuit. The negative half-wave rectified output, $e_o$, is taken from diode CR110. A positive half-wave rectified output, $e_o'$, is available from the output of diode CR111.

If desired, the negative half-wave rectified output, $e_0$, can be adjusted to twice the magnitude of the input $e_i$ and summed with the input $e_i$ to produce a full-wave rectified output which can be averaged by conventional means to provide a DC signal proportional to the magnitude of AC input $e_i$.

I claim:

1. A stable high speed switching circuit having feedback loops, the circuit comprising:
    a first amplifier having an input and an output;
    a second amplifier having an input connected to the output of first amplifier and having an output;
    a first compensating feedback loop comprising a first non-linear switching component serially coupled to a first capacitor, the first non-linear switching component having a first terminal connected to the output of said second amplifier and a second terminal connected to a first terminal of the first capacitor, the first capacitor having a second terminal connected to the input of said second amplifier; and
    an outer feedback loop comprising a first impedance having a first terminal connected to the second terminal of the first non-linear switching component, and having a second terminal connected to the input of the first amplifier.

2. A stable high speed switching circuit, as in claim 1, wherein the non-linear switching component comprises a complementary emitter-follower circuit.

3. A stable high speed switching circuit, as in claim 1, wherein the first and second amplifiers comprise successive stages of an operational amplifier.

4. A stable high speed switching circuit, as in claim 2, wherein the first and second amplifiers comprise successive stages in an operational amplifier.

5. A stable high speed switching circuit, as in claim 1, further comprising:
    an alternate compensating feedback loop comprising a second non-linear switching component serially coupled to a second capacitor, the second non-linear switching component having a first terminal connected to the output of said second amplifier and a second terminal connected to a first terminal of the second capacitor, the second capacitor having a second terminal connected to the input of said second amplifier, the second non-linear switching component being oriented opposite to the first non-linear switching component to provide a complementary current path; and
    a second impedance with a first terminal connected to the second terminal the second non-linear switching component, and having a second terminal connected to the input of the first amplifier.

6. A stable high speed switching circuit, as claimed in claim 5, wherein the first and second non-linear switching components comprise rectifiers.

7. A stable high speed switching circuit, as in claim 6, wherein the rectifiers comprise diodes.

8. A stable high speed switching circuit, as in claim 7, wherein:
    the first and second amplifiers comprise successive stages of an operational amplifier; and
    the circuit further comprises means for DC biasing the operational amplifier and means for AC coupling the first and second non-linear switching components to the output of the operational amplifier.

* * * * *